United States Patent [19]

Muller et al.

[11] Patent Number: 4,608,865

[45] Date of Patent: Sep. 2, 1986

[54] INTEGRATED PYROELECTRIC SENSOR AND METHOD

[75] Inventors: Richard S. Muller, Kensington; Dennis L. Polla, Berkeley, both of Calif.

[73] Assignee: The Regents of the University of California, Berkeley, Calif.

[21] Appl. No.: 678,871

[22] Filed: Dec. 5, 1984

[51] Int. Cl.[4] ............................................... G01F 1/68
[52] U.S. Cl. ...................................................... 73/204
[58] Field of Search .................. 73/204; 310/306, 310, 310/311, 343; 361/282, 285

[56] References Cited

U.S. PATENT DOCUMENTS

| 3,351,786 | 11/1967 | Muller et al. | |
|---|---|---|---|
| 3,519,924 | 7/1970 | Burton | 73/204 |
| 3,585,415 | 6/1971 | Muller et al. | |
| 3,992,940 | 11/1976 | Platzer, Jr. | |
| 4,332,157 | 6/1982 | Zemel et al. | 73/204 |
| 4,453,405 | 6/1984 | Zemel | 73/204 |

OTHER PUBLICATIONS

Electronics Letters, "Integrated Silicon Anemometer", 10/17/74, vol. 10: No. 21, A.F.P. VanPutten & S. Middelhoek.
*IEEE Transactions on Electron Devices,* "Monolithic Integrated Direction-Sensitive Flow Sensor", 1/82, vol. ED-29, No. 1, Johan H. Huijsing, Jacob P. Schuddemat, and Wouter Verhoef.
IEEE Int. Electron Devices Meeting, 12/5-7/83, "Monolithic Integrated Zinc-Oxide on Silicon Pyroelectric Anemometer, D. L. Polla, R. S. Muller and R. M. White.

*Primary Examiner*—Herbert Goldstein
*Attorney, Agent, or Firm*—Fitch, Even, Tabin & Flannery

[57] ABSTRACT

An integrated circuit pyroelectric sensor includes two MOSFETS coupled in a differential amplifier configuration, each MOSFET having a common source. A pyroelectric capacitor is coupled to the gate of a respective one of the MOSFET. A polysilicon filament is disposed between the pyroelectric capacitors which acts as a heating element when a current is passed therethrough. The voltage difference between the drain of each MOSFET is thus a function of the voltage difference between the pyroelectric capacitors. One of the pyroelectric capacitors is disposed at the leading edge of the sensor with respect to the direction of a fluid flow. The fluid flow across the sensor will cause the first capacitor to have a different temperature than the other capacitor of the trailing edge of the sensor whose temperature is a function of the temperature of the heating element. As the temperature of each pyroelectric capacitor changes, the amount of charge stored by each pyroelectric capacitor changes, thereby developing a differential voltage across the gates, and hence, the drains, of the integrated MOSFETS. Since the charge stored and voltage across each pyroelectric capacitor is a function of temperature, the differential voltage between the drains of each MOSFET is a function of temperature.

13 Claims, 8 Drawing Figures

INTEGRATED PYROELECTRIC SENSOR AND METHOD

The invention was made with government support under Grant No. ECS-8120562 awarded by the National Science Foundation. The government has certain rights in this invention.

The present invention relates generally to integrated circuit sensors and more particularly to a novel integrated circuit sensor having pyroelectric thin film elements and a method for making said sensors.

BACKGROUND OF THE INVENTION

One type of sensor known in the prior art is an anemometer, which is useful for measuring the fluid flow velocity of the medium. For example, in hot wire anemometry, a filament is exposed to the medium. A current is developed through the filament to heat the filament to a preselected temperature. As the medium flows past the filament, it has a cooling effect thereby dissipating heat from the filament. The amount of heat dissipated is a function of the fluid flow velocity. If the temperature of the filament is kept constant, it is obvious to one skilled in the art that the amount of current required to maintain the constant temperature of the filament would then be a function of the fluid flow velocity of the medium.

One such prior known integrated circuit anemometer utilizes the temperature sensitivity of integrated resistors. The integrated resistors are configured in a Wheatstone bridge circuit. When an air flow is present across the sensor, the resistors, which are heated by the bridge current, will be cooled. The temperature decrease of the resistors which are normal to the flow is somewhat larger than the temperature decrease of the resistors which are parallel to the flow. Because the value of the diffused resistors are a funtion of their temperature coefficient, the bridge becomes unbalanced and the bridge output voltage is a measure of the air flow. One particular known diffused resistor anemometer provides a direct bridge output signal without amplification of two microvolts per millisecond of air flow across the bridge.

However, a significant disadvantage and limitation of a diffused resistor anemometer is that the four diffused resistors, using known integrated circuit processing techniques, cannot be made perfectly equal, and therefore the bridge will inherently be unbalanced. Thus, the Wheatstone bridge will also develop a signal as a function of changes in ambient temperature although there is no flow of the medium present across the integrated resistors.

Another type of integrated circuit anemometer utilizes the temperature sensitivity of P-N junction diodes, as disclosed in U.S. Pat. No. 3,992,940. Disclosed therein is a fluid flow sensor for measuring the mass flow of a fluid in a passageway. The sensor includes three solid state diodes wherein two are fabricated on a chip separate from the chip on which the third diode is fabricated. The first diode is responsive to force convective heat transfer by the fluid flowing thereover for generating a first electrical signal. The third diode is responsive to temperature of the fluid thereover for generating a second electrical signal. The second diode is responsive to both the first and second electrical signals for maintaining the first diode at a predetermined temperature above the third diode. The amount of current required to maintain the first diode at a predetermined temperature above the temperature of the third diode is proportional to the mass rate of the fluid flowing over the sensor.

A significant disadvantage and limitation of the diode type integrated anemometer is that two separate chips must be fabricated for each device. Another disadvantage and limitation of the diode type anemometer is that current required to maintain the diode a preselected temperature is not linearly dependent on fluid flow velocity, but the relationship has to be determined empirically. Each diode type anemometer will require different calibrations because of differences of devices from processing integrated circuits.

Another type of known anemometer utilizes the temperature sensitivity of the base-collector junction of a bipolar transistor. The measuring transistors are arranged in a differential amplifier configuration, with a heating transistor located intermediate the two sensing transistors. The differential output voltage measured across the collector of each of the measuring transistors will be a function of the temperature difference between the two measuring transistors. Typically, the transistors are disposed with one at the leading edge and the other at the trailing edge of the sensor with respect to the flow vector. Obviously, the transistor at the leading edge will be subject to greater cooling by the flow than the transistor at the trailing edge.

A significant disadvantage and limitation of the bipolar type sensor is that the temperature difference is proportional to the square root of the flow velocity at very low velocity, such as velocities less than one meter per second. The square root proportionality does not hold for larger flow velocities. Thus, the bipolar anemometer is not linear over the range of velocity which may be sensed. Also, a further disadvantage and limitation of the bipolar anemometer is that the unamplified differential voltage is too small to be useful for measuring. Subsequent amplification of the "raw" differential voltage which also amplifies calibration errors and noise creates inaccuracies in measuring fluid flow velocity.

SUMMARY OF INVENTION

It is therefore an object of the present invention to provide a novel apparatus and method for making such apparatus which overcomes one or more of the disadvantages and limitations enumerated above.

A primary object of the present invention is to provide an integrated circuit anemometer in which sensing elements develop an output voltage which is linear and proportional to fluid flow velocity.

Another object of the present invention is to provide such a sensor which requires only a single silicon chip for integration, signal detection, signal transduction and signal conditioning.

A further object of the present invention is to provide an integrated circuit anemometer wherein the unamplified differential voltage is significantly greater than prior known integrated circuit anemometers.

According to the present invention, an integrated circuit anemometer includes two pyroelectric capacitors fabricated on a silicon substrate. As the temperature of the pyroelectric capacitors changes, the amount of charge stored by each capacitor changes, hence a differential voltage may be obtained between the two pyroelectric capacitors. Each capacitor is coupled to the gate of an associated MOSFET which is integrated in the substrate. The two MOSFETS are coupled in a differential amplifier configuration. The voltage between the drain of each MOSFET is thus a function of the voltage difference between the pyroelectric capacitors. The anemometer of the present invention further includes a heating element disposed intermediate the pyroelectric capacitors.

In one aspect of the present invention, the pyroelectric capacitors are formed from zinc oxide thin films which are encapsulated by the silicon dioxide layer. The heating filament is formed from a deposited polysilicon filament through which a current is passed.

In yet another aspect of the present invention, a single pyroelectric capacitor is useful for detecting incident thermal or infrared radiation upon the sensor. As the temperature of the pyroelectric capacitor changes, its surface charge changes. The pyroelectric capacitor may be coupled across the inputs to the differential amplifier to obtain an output voltage which is a function of the temperature of the pyroelectric capacitor.

These and other objects, advantages, and features of the present invention will become apparent from the following specification and appended claims when read in connection with the drawings wherein:

FIGS. 1A-E illustrate fabrication steps of a cross section of an anemometer constructed according to the principles of the present invention;

DETAILED DESCRIPTION OF THE PREFERRED EMBODIMENTS

Figure 1A:
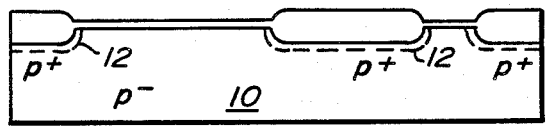
Figure 1B:
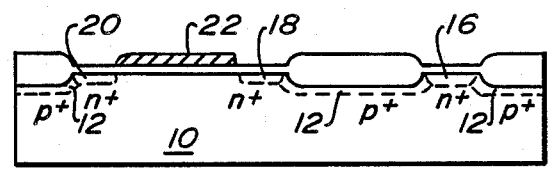
Figure 1C:
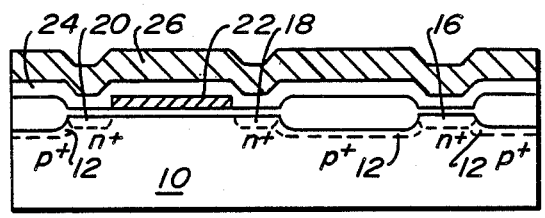
Figure 1D:
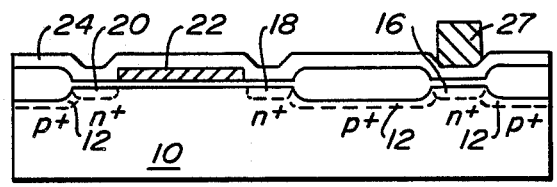

Referring now to FIGS. 1A-F, there is shown a portion of an anemometer in cross section to illustrate the major fabrication steps in processing of zinc oxide thin film pyroelectric capacitors to form an anemometer according to the principles of the present invention. With further reference to FIG. 2, there is shown the equivalent circuit diagram of the complete anemometer according to the present invention. In one embodiment of the present invention, the sensor is formed utilizing a p− substrate 10. Selected areas of substrate 10 are exposed to a p-type dopant to form a plurality of p+ channels 12 which will define active areas and channel-stops for devices fabricated in substrate 10. An oxide layer 14 is grown on the substrate and selectively etched as indicated in FIG. 1B to expose substrate 10 to a n-type dopant to form a plurality of n+ regions 16, 18 and 20. N+ region 16 is a bottom electrode of the pyroelectric capacitors illustrated in FIG. 2, such as pyroelectric capacitor 30. N+ regions 18 and 20 will form the channels of MOSFET transistors 34 and 36, respectively. Because of the symetrical geometry of the device, only pyroelectric capacitor 30 is being illustrated in FIGS. 1A-F.

After N+ regions 16, 18 and 20 have been formed, a polysilicon layer is deposited on substrate 10 and selectively etched to form a polysilicon filament 22 disposed between N+ region 18 and N+ region 20.

After polysilicon filament 22 has been delineated, a chemically vapor deposited (CVD) silicon dioxide layer 24 is deposited on substrate 10. Also as seen in FIG. 1C, a zinc oxide deposition 26 is placed on top of the CVD oxide layer 24. Zinc oxide layer 26 is selectively etched (FIG. 1d) so that a zinc oxide thin film 27 remains above N+ region 16. Of course a second zinc oxide thin film is similarly formed to construct pyroelectric capacitor 32.

Figure 1E:
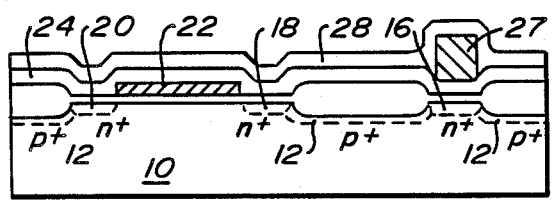
Figure 1F:
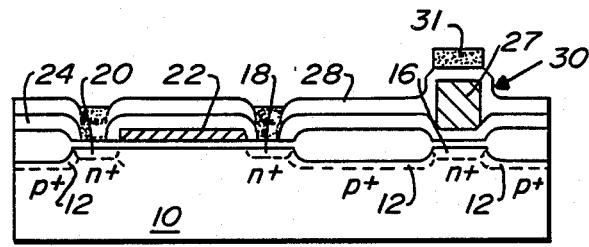
Figure 2:
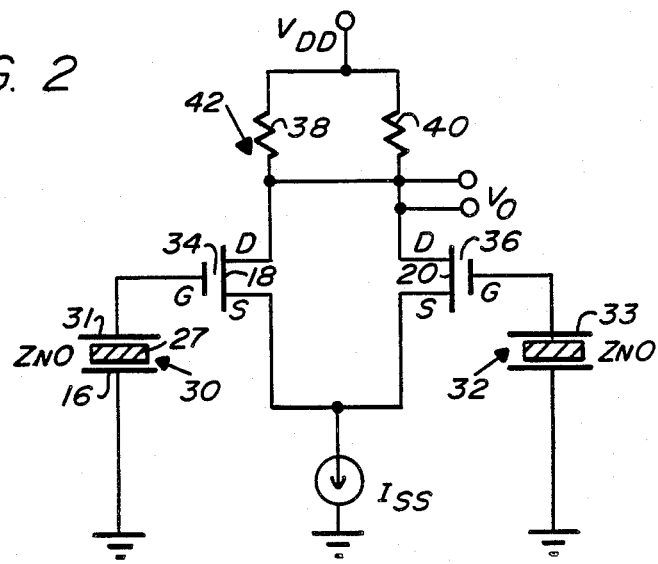
FIG. 2 is a schematic diagram of the anemometer of FIG. 1.

As seen in FIG. 1E, after the zinc oxide layer 26 has been selectively etched, a further CVD oxide layer 28 is deposited on substrate 10 to encapsulate the zinc oxide thin films. The oxide layers are selectively etched above N+ regions 18 and 20 so that a thin dielectric layer remains. As seen in FIG. 1F, an aluminum metallization is deposited and selectively etched so that the gate of a mosfet is formed above N+ regions 18 and 20 and connection made between a second electrode 31 and 33 of the respective one of pyroelectric capacitors 30 and 32 to the respective one of the gates as best seen in FIG. 2. Second electrode 31 and 33 are formed in the aluminum deposition step.

In FIG. 2 it is seen that pyroelectric capacitors 30 and 32 are coupled to the gate of a respective one of mosfet transistors 34 and 36. Mosfets 34 and 36 are arranged in a differential amplifier configuration with the source S of each mosfet electrically coupled to each other and to a current sink $I_{ss}$. A resistor 38 is coupled to the drain of mosfet 34 and resistor 40 is coupled to the drain of mosfet 36. Supply potential, indicated by VDD, is applied to each of resistors 38 and 40. The output voltages obtained between the drain of each mosfet 34 and 36. Thus, the voltage difference existing between pyroelectric capacitor 30 and pyroelectric capacitor 32 will be proportionally amplified by the differential amplifier 42 to develop the output voltage $V_o$.

To measure fluid flow velocity, a current is induced through polysilicon filament 22 which disapates heat through resistive losses. Ideally, substrate 10 is to be heated to a temperature at least greater than the temperature of the ambient fluid. Polysilicon filament 22 is disposed intermediate pyroelectric capacitors 30 and 32, with one pyroelectric capacitor being upstream from the heat source and the other pyroelectric capacitor being downstream from the heat source of polysilicon filament 22. Since pyroelectric capacitors 30 and 32 will be cooled at different rates because of their upstream or downstream placement from the heat source, a differential voltage will be applied to differential amplifier 42, comprised of MOSFETS 34 and 36, current sink ISS and resistors 38 and 40. The output voltage $V_O$ of differential amplifier 42 will be linearly proportional to the difference of voltage between pyroelectric capacitors 30 and 32 as well as to the fluid flow velocity.

In one embodiment of the present invention, fabrication of the anemometer may be more particularly described as using 4 micron design and 4 mask NMOS fabrication technology. The starting material may be at 25 OHM centimenter p-type substrate. An initial oxidation is to form a 75 nanometer gate oxide, the first photolitographic step using silicon nitrite in conjunction with anasotropic dry etching to define the active device regions on the chip. A boran channel stop is then ion implanted (dose=$2 \times 10^{13}$ cm$^{-2}$) at an energy of 100 KEV. Local oxidation then forms a thick field oxide and drives in the p-type channel stop. The silicon nitride layer is then removed with phosphoric acid. In order to avoid loading the pyroelectric signal with bias circuitry, the MOSFETS 34 and 36 are depletion type, obtained through a threshold adjusting implant or arsenic (dose=$1 \times 10^{12}$ cm$^{-2}$) at an energy of 130 KEV. Polysilicon is next deposited at 635° C. to form the NMOS gates, the heater resistor and the amplifier resistor loads. After patterning, the source strain regions as well as the bottom electrode for the zinc oxide pyroelectric capacitors formed by a heavy phosphorus implantation (dose=$3 \times 10^{15}$ cm$^{-2}$) at an energy of 140 KEV. A 0.5 micron CVD oxide doped with phosphorus is then deposited for encapsulation. The p glass dielectric, in addition to protecting underlying devices from sodium ion contamination, is used to protect the NMOS transistors during subsequent zinc oxide sputtering. This is a critical step in controlling NMS threshold voltages. Thin film (2 micron) capacitors of zinc oxide are next formed by RF planar magnatron sputtering at 200 watts for 1.5 hours at 10 millitorr using a 40% argon, 60% oxygen gas mixture. The substrate to source distance is 4 centimeters and the substrate temperature is maintained at 240° C.

Zinc oxide patterning is carried out using an etchant of acetic acid: phosphoric acid: DIH$_2$O (1:1:30). A second layer of CVD oxide is then deposited over the entire wafer surface to provide for electrical isolation of the zinc oxide thin film. Such processing techniques are useful for providing individual anemometer chips measuring 6 by 8 millimeters out of a 2 inch diameter substrate.

Figure 3:
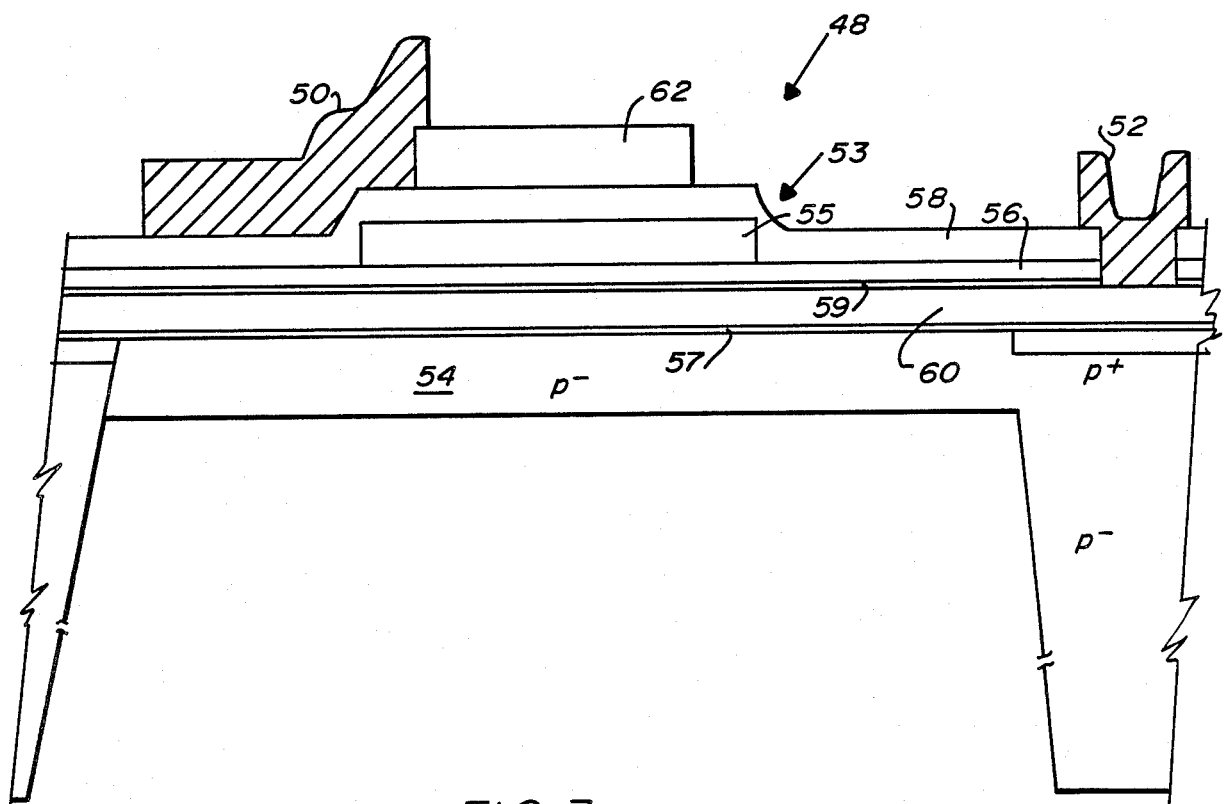
FIG. 3 is a cross-sectional view of an integrated circuit infrared detector utilizing a single pyroelectric capacitor.

Referring now to FIG. 3, there is shown an infrared radiation detector 48 constructed according to the principles of the present invention. The device uses differential amplifier 42 as illustrated in FIG. 2 with connections to the MOSFETS 34 and 36 being made to aluminum regions 50 and 52, respectively. Infrared detector 48 utilizes one zinc oxide pyroelectric capacitor 53. The reverse side of the substrate is selectively etched away to form a thin membrane region 54 to minimize heat sinking of the pyroelelctric capacitor 53 when detecting infrared radition. The zinc oxide layer 55 is encapsulated by a first CVD silicon oxide layer 56 and a second CVD silicon oxide layer 58. A polysilicon layer 60 is disposed intermediate membrane 54 and CVD oxide layer 56, with thermally grown silicon oxide layers on membrane 54 and polysilicon layer 60. The upper electrode 62 of capacitor 53 is formed from thin film sputtering of tin oxide or vacuum evaporation of chromium. The top side electrode 62 is exposed to the infrared radiation.

When electrode 62 is exposed to infrared radiation, the temperature in the thin membrane structure of zinc oxide thin film 55 will induce a change in the internal dipole moment of its crystal which is compenstated by surface charge across the electrodes of the thin film capacitor, polysilicon layer 60 forming the bottom side electrode. Thus, CVD oxide layers 56 and 58 are selectively etched away so that aluminization may be deposited and etched to form aluminum region 52 in contact with polysilicon layer 60 for coupling to the gate of one of MOSFETS 34 or 36. Thus, by measuring the charge and hence voltage on pyroelectric capacitor 53, the incident infrared radiation may be detected.

It is of course understood that although the preferred embodiments of the present invention have been illustrated and described, various modifications, alternatives and equivalents thereof will become apparent to those skilled in the art. Accordingly, the scope of the present invention should be defined and limited only by the appended claims and equivalents thereof.

We claim:

1. An integrated pyroelectric sensor for measuring fluid flow velocity of a medium comprising:
    a semiconductor substrate;
    a pair of pyroelectric capacitors fabricated on said substrate, each of said pyroelectric capacitors developing a voltage as a function of its temperature, the temperature of said pyroelectric capacitors changing in response to the fluid flow of said medium about said sensor;
    means for heating said substrate to a selected temperature at least greater than the ambient temperature of said medium; and
    means for measuring the voltage difference between said pyroelectric capacitors, the fluid flow velocity being a function of said voltage difference.

2. A sensor as set forth in claim 1 wherein each of said pyroelectric capacitors include a zinc oxide thin film dielectrically insulated from said substrate.

3. A sensor as set forth in claim 2 wherein each of said pyroelectric capacitors further include;
    a first electrode formed in said substrate and having an opposite conductivity type from said substrate and disposed beneath said zinc oxide thin film associated therewith; and
    a second electrode disposed above said zinc oxide thin film associated therewith and dielectrically insulated therefrom.

4. A sensor as set forth in claim 2 wherein each of said capacitors are a one micron thin film.

5. A sensor as set forth in claim 4 which further includes:
    a dielectric layer encapsulating each said zinc oxide thin film.

6. A sensor as set forth in claim 5 wherein said dielectric layer is a chemically vapor deposited silicon dioxide.

7. A sensor as set forth in claim 1 wherein said measuring means includes differential amplifier means responsive to the voltage of each of said pyroelectric capacitors for developing an output voltage as a function of the difference between the voltage on each of said pyroelectric capacitors.

8. A sensor as set forth in claim 7 wherein said differential amplifier means includes a pair MOSFETS integrated into said substrate, each of said MOSFETS having a drain, a source and a gate, each of said pyroelectric capacitors being coupled to said gate of an associated one of said MOSFETS, said source of each of said MOSFETS being electrically coupled to each other, said output voltage being the difference between the voltage at said drain of each of said MOSFETS.

9. A sensor as set forth in claim 8 wherein said MOSFETS are depletion mode devices integrated into said substrate and having a channel of opposite conductivity type from said substrate.

10. A sensor as set forth in claim 9 wherein said differential amplifier means further includes a current sink coupled to each said source to sink a substantially constant current to said substrate; and
    a resistor associated with each said drain and coupled thereto, each said resistor beam for providing a current path from a source of potential to each said gate.

11. A sensor as set forth in claim 1 wherein said heating means includes:
    a polysilicon filament in thermal conduction with said substrate, said polysilicon filament radiating heat energy when a current is developed therethrough.

12. A sensor as set forth in claim 11 wherein said polysilicon filament is disposed intermediate each of said pyroelectric capacitors.

13. A sensor as set forth in claim 5 wherein said dielectric layer is a chemically vapor deposited silicon dioxide.

* * * * *